(12) United States Patent
Oota et al.

(10) Patent No.: US 9,564,337 B2
(45) Date of Patent: Feb. 7, 2017

(54) POLISHING LIQUID AND METHOD FOR POLISHING SUBSTRATE USING THE POLISHING LIQUID

(75) Inventors: Munehiro Oota, Ibaraki (JP); Takaaki Tanaka, Ibaraki (JP); Toshio Takizawa, Ibaraki (JP); Shigeru Yoshikawa, Ibaraki (JP); Takaaki Matsumoto, Ibaraki (JP); Takahiro Yoshikawa, Ibaraki (JP); Takashi Shinoda, Ibaraki (JP)

(73) Assignee: HITACHI CHEMICAL CO., LTD., Tokyo (JP)

(*) Notice: Subject to any disclaimer, the term of this patent is extended or adjusted under 35 U.S.C. 154(b) by 0 days.

(21) Appl. No.: 13/884,883

(22) PCT Filed: Dec. 22, 2011

(86) PCT No.: PCT/JP2011/079873
§ 371 (c)(1),
(2), (4) Date: May 10, 2013

(87) PCT Pub. No.: WO2012/086781
PCT Pub. Date: Jun. 28, 2012

(65) Prior Publication Data
US 2013/0260558 A1 Oct. 3, 2013

(30) Foreign Application Priority Data
Dec. 24, 2010 (JP) .............................. P2010-287594

(51) Int. Cl.
*H01L 21/306* (2006.01)
*B24B 37/04* (2012.01)
(Continued)

(52) U.S. Cl.
CPC ....... *H01L 21/30625* (2013.01); *B24B 37/044* (2013.01); *C09G 1/02* (2013.01); *C09K 3/1463* (2013.01); *H01L 21/31053* (2013.01)

(58) Field of Classification Search
None
See application file for complete search history.

(56) References Cited

U.S. PATENT DOCUMENTS 6,224,464 B1 5/2001 Nojo et al.
6,419,557 B2 7/2002 Nojo et al.
(Continued)

FOREIGN PATENT DOCUMENTS

CN 1453328 A 11/2003
CN 1572424 A 2/2005
(Continued)

OTHER PUBLICATIONS

International Search Report issued in corresponding application PCT/JP2011/079873, completed in Jan. 11, 2012 and mailed Jan. 24, 2012.
(Continued)

Primary Examiner — Allan Olsen
(74) Attorney, Agent, or Firm — Griffin and Szipl PC

(57) ABSTRACT

Provided is a polishing liquid including cerium oxide particles, an organic acid A, a polymer compound B having a carboxyl acid group or a carboxylate group, and water, wherein the organic acid A has at least one group selected from the group consisting of —COOM group, -Ph-OM group, —SO$_3$M group and —PO$_3$M$_2$ group, pKa of the organic acid A is less than 9, a content of the organic acid A is 0.001 to 1 mass % with respect to the total mass of the polishing liquid, and a content of the polymer compound B is 0.01 to 0.50 mass % with respect to the total mass of the polishing liquid, and pH is in the range of 4.0 to 7.0.

7 Claims, 1 Drawing Sheet

(51) Int. Cl.
*C09K 3/14* (2006.01)
*H01L 21/3105* (2006.01)
*C09G 1/02* (2006.01)

(56) References Cited

U.S. PATENT DOCUMENTS

| | | | |
|---|---|---|---|
| 2001/0034191 A1 | 10/2001 | Nojo et al. | |
| 2002/0098697 A1* | 7/2002 | Shimazu et al. | 438/691 |
| 2003/0196386 A1* | 10/2003 | Hattori et al. | 51/307 |
| 2004/0132305 A1* | 7/2004 | Nishimoto | C09G 1/02 438/690 |
| 2004/0235396 A1* | 11/2004 | Hattori | H01L 21/31053 451/41 |
| 2005/0001199 A1* | 1/2005 | Hattori | C09K 3/1463 252/72 |
| 2005/0022456 A1* | 2/2005 | Babu et al. | 51/307 |
| 2006/0186089 A1* | 8/2006 | Shida | C09G 1/02 216/88 |
| 2007/0099427 A1* | 5/2007 | Oh et al. | 438/692 |
| 2007/0181534 A1* | 8/2007 | Kamimura | B24B 37/044 216/88 |
| 2007/0191244 A1* | 8/2007 | Cho et al. | 510/175 |
| 2007/0218811 A1* | 9/2007 | Kurata et al. | 451/28 |
| 2007/0281483 A1* | 12/2007 | Mueller | 438/692 |
| 2008/0086950 A1* | 4/2008 | Kon et al. | 51/306 |
| 2008/0254717 A1* | 10/2008 | Fukasawa et al. | 451/36 |
| 2010/0087065 A1* | 4/2010 | Boggs et al. | 438/692 |
| 2010/0099260 A1* | 4/2010 | Matsumoto | C09G 1/02 438/693 |
| 2010/0210109 A1 | 8/2010 | Fukasawa et al. | |
| 2011/0008967 A1* | 1/2011 | Kim et al. | 438/693 |
| 2011/0009033 A1* | 1/2011 | Tanaka | C09G 1/02 451/36 |
| 2011/0045741 A1* | 2/2011 | Ahn et al. | 451/28 |
| 2012/0270399 A1* | 10/2012 | Shin et al. | 438/692 |

FOREIGN PATENT DOCUMENTS

| | | |
|---|---|---|
| CN | 101189706 A | 5/2008 |
| CN | 101333418 A | 12/2008 |
| CN | 101374922 A | 2/2009 |
| CN | 101432854 A | 5/2009 |
| CN | 101689494 A | 3/2010 |
| JP | 10-106994 A | 4/1998 |
| JP | 3278532 B2 | 2/2002 |
| JP | 2003-313542 A | 11/2003 |
| JP | 2005-026604 A | 1/2005 |
| JP | 2006-339594 A | 12/2006 |
| JP | 2009-524236 A | 6/2009 |
| JP | 2009-231795 A | 10/2009 |
| JP | 2009-278061 A | 11/2009 |
| JP | 2010-003732 A | 1/2010 |
| JP | 2010-161201 A | 7/2010 |
| JP | 2010-199595 A | 9/2010 |
| TW | 200300168 | 5/2003 |
| WO | 03/038883 A1 | 5/2003 |
| WO | 2006/035771 A1 | 4/2006 |
| WO | 2006/035779 A1 | 4/2006 |
| WO | 2006/132055 A1 | 12/2006 |

OTHER PUBLICATIONS

English translation of International Preliminary Report on Patentability issued in counterpart application PCT/JP2011/079873 on Jul. 2, 2013.

English translation of Office Action dated Aug. 28, 2012 for JP Patent Application No. P2011-282023.

English translation of Office Action dated Nov. 27, 2012 for JP Patent Application No. P2011-282023.

English translation of Notice of Allowance dated Jul. 2, 2013 for JP Patent Application No. P2011-282023.

English translation of Office Action dated Aug. 15, 2013 for TW Patent Application No. 100148169.

* cited by examiner (a)
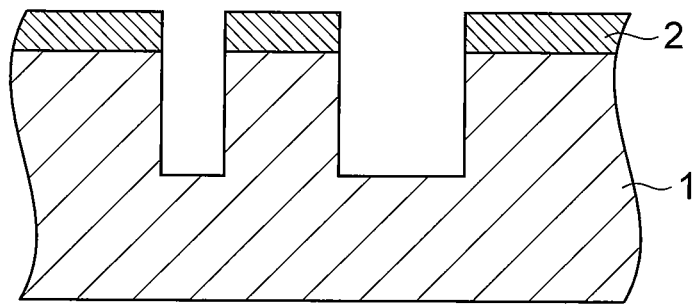
(b)
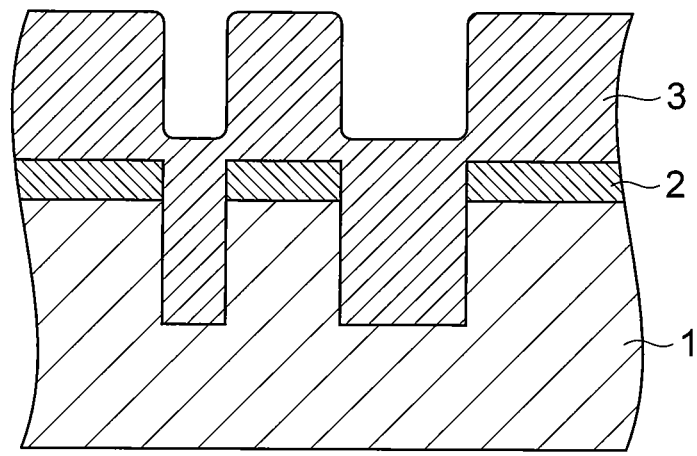
(c)
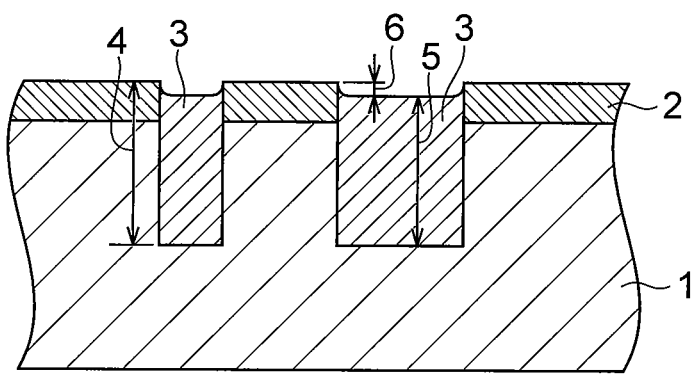

POLISHING LIQUID AND METHOD FOR POLISHING SUBSTRATE USING THE POLISHING LIQUID

This is a National Phase Application in the United States of International Patent Application No. PCT/JP2011/079873 filed Dec. 22, 2011, which claims priority on Japanese Patent Application No. P2010-287594, filed Dec. 24, 2010. The entire disclosures of the above patent applications are hereby incorporated by reference.

TECHNICAL FIELD

The present invention relates to a polishing liquid and a method for polishing a substrate using the polishing liquid. More particularly, the present invention relates to a polishing liquid for use in production of semiconductor devices, for example, a smoothening process of a substrate surface, especially, a smoothening process of an interlayer dielectric film and a BPSG film (silicon dioxide film doped with boron and phosphorous), and a process of forming a shallow trench isolation (STI), and also relates to a method for polishing a substrate using the polishing liquid.

BACKGROUND ART

In production of an ultra large scale integrated (ULSI) semiconductor device, a processing technique for achieving high density and miniaturization of a semiconductor device is currently being studied and developed. One of the processing techniques, a chemical mechanical polishing (CMP) technique becomes essential in production of semiconductor devices for the smoothening of an interlayer dielectric film, the formation of a shallow trench isolation (STI), and the formation of plugs and embedded metal wirings.

In a conventional production process of semiconductor devices, an inorganic insulation film such as a silicon oxide film is formed through plasma CVD (chemical vapor deposition), low-pressure CVD, etc. A fumed silica-based polishing liquid is commonly studied as a chemical mechanical polishing liquid for use in smoothening of the inorganic insulation film. The fumed silica-based polishing liquid is prepared by adjusting the pH of slurry in which particles obtained through grain growth using a method such as thermal decomposition of silicon tetrachloride are mixed. However, the fumed silica-based polishing liquid still has a technical problem that a polishing speed is low.

Also, in the generation of a design rule of 0.25 μm or later, STI has been used for isolation of devices in an integrated circuit. For STI, CMP technique is used for removal of an excessive silicon oxide film formed on a substrate. In this case, a stopper film with a low polishing speed is formed under the silicon oxide film so as to stop polishing at a given depth. A silicon nitride film or the like is used as the stopper film. Not only to effectively remove the excessive silicon oxide film but also to sufficiently prevent the progress of polishing thereafter, a polishing speed ratio between the silicon oxide film and the stopper film is preferably high. However, a conventional colloidal silica-based polishing liquid has a low polishing speed ratio of about 3 between the silicon oxide film and the stopper film, and thus does not have sufficient properties practically usable for STI.

As a polishing liquid for the surface of a glass such as a photomask and a lens, a cerium oxide polishing liquid containing cerium oxide particles is in use. Since the cerium oxide particles are lower in hardness than silica particles or alumina particles and are less likely to cause a polishing surface to be scratched during polishing, the cerium oxide particles are useful for finishing mirror-surface polishing. Furthermore, the cerium oxide polishing liquid has an advantage that the polishing speed is faster than that of a silica polishing liquid such as a fumed silica- or colloidal silica-based polishing liquid.

As the cerium oxide polishing liquid, Patent Literature 1 below discloses a chemical mechanical polishing liquid for semiconductors using high-purity cerium oxide abrasive particles. Also, Patent Literature 2 below discloses a technique for adding an additive in order to control a polishing speed of a cerium oxide polishing liquid and improve global smoothness.

PRIOR ART LITERATURES

Patent Literature

[Patent Literature 1] Japanese Patent Application Laid-open No. H10-106994
[Patent Literature 2] Japanese Patent No. 3278532

SUMMARY OF INVENTION

Technical Problem

However, as a design rule for wiring or STI progressively shrinks, it is further required to improve smoothness for the cerium oxide polishing liquid (for example, to reduce a dishing amount of an insulation film). Also, improvement of precision in production of semiconductor devices is increasingly demanded, for example, it is required that a difference in residual film thickness between insulation films in regions with different trench densities should be small or an excessively polished amount of a stopper film should be small. Furthermore, the high likelihood of a polishing process is also important in production of highly precise semiconductor devices.

The present invention was made in consideration of the above-described actual situations, and an object of the present invention is to provide a polishing liquid and a method for polishing a substrate using the polishing liquid, capable of improving a polishing speed of a polishing target film and improving smoothness after polishing, in a CMP technique of polishing a polishing target film which is formed on the surface of a substrate.

Solution to Problem

To solve the problems above, the present invention provides a polishing liquid for chemical mechanical polishing (CMP) including cerium oxide particles, an organic acid A, a polymer compound B having a carboxyl acid group or a carboxylate group, and water, wherein the organic acid A has at least one group selected from the group consisting of —COOM group, -Ph-OM group (phenolic-OM group), —SO$_3$M group, and —PO$_3$M$_2$ group (where, M is at least one selected from the group of H, NH$_4$, Na and K, and Ph represents a phenyl group which may have a substituent), pKa of the organic acid A is less than 9, a content of the organic acid A is 0.001 to 1 mass % with respect to the total mass of the polishing liquid, and a content of the polymer compound B is 0.01 to 0.50 mass % with respect to the total mass of the polishing liquid, and pH ranges between 4.0 to 7.0.

The polishing liquid of the present invention can improve a polishing speed of a polishing target film and also improve smoothness after polishing in a CMP technique of polishing a polishing target film (for example, an interlayer dielectric film, a BPSG film, an STI film) formed on the surface of a substrate.

The polishing liquid of the present invention may be stored as a two-liquid type polishing liquid including a first liquid and a second liquid, where the first liquid contains cerium oxide particles, and water, and the second liquid contains an organic acid A, a polymer compound B, and water. This makes it possible to more stably maintain dispersion stability of the cerium oxide particles until just prior to using a polishing liquid, and therefore the polishing speed and smoothness can be more effectively improved.

Also, in the polishing liquid of the present invention, it is desirable that the first liquid further includes a dispersant. This enables the dispersion stability of cerium oxide particles to be more excellently maintained.

The present invention also provides a polishing method of a substrate, for polishing a polishing target film formed on the surface of the substrate by using the polishing liquid of the present invention. According to the polishing method using the polishing liquid of the present invention, it is possible to improve the polishing speed of the polishing target film and also to improve smoothness after polishing.

Advantageous Effects of Invention

According to the present invention, it is possible to provide a polishing liquid and a method for polishing a substrate using the polishing liquid, capable of improving a polishing speed of a polishing target film and also improving surface smoothness after polishing, in a CMP technique of polishing the polishing target film (for example, STI film) which is formed on the surface of the substrate.

BRIEF DESCRIPTION OF DRAWINGS

FIG. 1 is a schematic sectional diagram illustrating an evaluation substrate for polishing properties.

DESCRIPTION OF EMBODIMENTS

Hereinafter, embodiments of the present invention will be described below in detail.

[Polishing Liquid]

A polishing liquid according to a current embodiment is a polishing liquid for chemical mechanical polishing (CMP), which contains cerium oxide particles, a dispersant, an organic acid A, a polymer compound B, and water. Hereinafter, each component contained in the polishing liquid according to the current embodiment will be fully described.

(Cerium Oxide Particles)

As cerium oxide particles, well-known materials may be used without particular limitation. In general, cerium oxide is obtained by oxidation of a cerium compound such as carbonate, nitrate, sulfate, and oxalate. The cerium oxide particles may be prepared by, for example, calcination, oxidation with hydrogen peroxide, or the like.

The cerium oxide particles for use in polishing of a silicon oxide film formed by TEOS-CVD or other methods allows higher-speed polishing, but causes more polishing scratches on a polishing target film, when the crystallite diameter (diameter of crystallite) of the cerium oxide particle becomes greater and the crystal distortion is smaller, i.e., when the crystallinity thereof is higher. From this point of view, the cerium oxide particle is preferably composed of two or more crystallites and has crystal grain boundaries, and more preferably, has the crystallite diameter ranging from 1 to 300 nm.

The crystallite diameter may be measured through observation using a scanning electron microscope (SEM). Specifically, a major axis and a minor axis of the particle are measured from an image obtained by the SEM, and the square root of the product of the major axis and the minor axis is determined as a particle diameter.

The content of alkali metals and halogens in the cerium oxide particle is preferably 10 ppm or less because the particle may be favorably used for polishing during production of semiconductor devices.

The average particle diameter of the cerium oxide particles is preferably in the range of 10 to 500 nm, more preferably in the range of 20 to 400 nm, and even more preferably in the range of 50 to 300 nm. If the average particle diameter of the cerium oxide particles is 10 nm or more, good polishing speed tends to be achieved; and if the average particle diameter is 500 nm or less, the polishing target film is less likely to be scratched.

Herein, the average particle diameter of the cerium oxide particles means the D50 value (median diameter of volumetric distribution, cumulative median value), as measured with a laser diffraction particle size distribution analyzer (for example, Master Sizer Microplus (refractive index: 1.93, light source: He—Ne laser, and absorption: 0) manufactured by Malvern Instrument Ltd.). A sample in which a polishing liquid is diluted to a suitable concentration (for example, concentration at which transmittance (H) becomes 60-70% as measured with He—Ne laser) is used in measuring of the average particle diameter. Also, when the cerium oxide polishing liquid is divided into a cerium oxide slurry in which cerium oxide particles are dispersed in water, and an additive solution in which an additive is dissolved in water, and the cerium oxide slurry and the additive solution are separately stored, the measurement may be carried out by diluting the cerium oxide slurry to a suitable concentration.

In view of the tendency that a good polishing speed is achieved, the content of the cerium oxide particles is preferably 0.1 mass % or more, and more preferably 0.5 mass % or more, based on a total mass of the polishing liquid. Also, considering that the aggregation of the particles is prevented and thus the polishing target film is less likely to be scratched, the content of the cerium particles is preferably 20 mass % or less, more preferably 5 mass % or less, and even more preferably 1.5 mass % or less.

(Organic Acid A)

The polishing liquid according to the current embodiment includes, as an organic acid A, an organic acid and/or salts thereof. Thus, it is possible to increase a polishing speed and also improve smoothness of the polishing target film (for example, silicon oxide film) after the polishing is completed. More specifically, when an uneven polishing target surface is polished, a polishing time may be shortened, and furthermore, a phenomenon in which a portion of the surface is excessively polished to have a caved-in shape like a dish, which is so-called dishing, can be prevented. This effect can be more effectively achieved by combined use of the organic acid and/or salts thereof and the cerium oxide particles.

The organic acid and/or salts thereof has at least one group selected from the group consisting of —COOM group, -Ph-OM group (phenolic-OM group), —$SO_3M$ group, and —$PO_3M_2$ group (where, M is at least one selected from the group of H, $NH_4$, Na and K, and Ph represents a phenyl group which may have a substituent), and is preferably a water-soluble organic compound.

For examples, the organic acid A may include: a carboxylic acid such as formic acid, acetic acid, propionic acid, butyric acid, valeric acid, cyclohexane carboxylic acid, phenylacetic acid, benzoic acid, o-toluic acid, m-toluic acid, p-toluic acid, o-methoxybenzoic acid, m-methoxybenzoic acid, p-mthoxybenzoic acid, acrylic acid, methacrylic acid, crotonic acid, pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, heptadecenoic acid, isobutyric acid, isovaleric acid, cinnamic acid, quinaldic acid, nicotinic acid, 1-naphthoic acid, 2-naphthoic acid, picolinic acid, vinylacetic acid, phenylacetic acid, phenoxyacetic acid, 2-furancarboxylic acid, mercaptoacetic acid, levulinic acid, oxalic acid, malonic acid, succinic acid, glutaric acid, adipic acid, pimelic acid, suberic acid, azelaic acid, sebacic acid, 1,9-nonanedicarboxylic acid, 1,10-decandicarboxylic acid, 1,11-undecanedicarboxylic acid, 1,12-dodecane dicarboxylic acid, 1,13-tridecane dicarboxylic acid, 1,14-tetradecane dicarboxylic acid, 1,15-pentadecane dicarboxylic acid, 1,16-hexadecane dicarboxylic acid, maleic acid, fumaric acid, itaconic acid, citraconic acid, mesaconic acid, quinolinic acid, quinic acid, naphthalic acid, phthalic acid, isophthalic acid, terephthalic acid, glycollic acid, lactic acid, 3-hydroxypropionic acid, 2-hydroxybutyric acid, 3-hydroxybutyric acid, 4-hydroxybutyric acid, 3-hydroxyvaleric acid, 5-hydroxyvaleric acid, quinic acid, kynurenic acid, salicylic acid, tartaric acid, aconitinic acid, ascorbic acid, acetylsalicylic acid, acetylmalic acid, acetylene dicarboxylic acid, acetoxy succinic acid, acetylacetic acid, 3-oxoglutaric acid, atropic acid, atrolactic acid, anthraquinone carboxylic acid, anthracene carboxylic acid, isocaproic acid, isocamphoronic acid, isocrotonic acid, 2-ethyl-2-hydroxybutyric acid, ethylmalonic acid, ethoxy acetic acid, oxaloacetic acid, oxydiacetic acid, 2-oxobutanoic acid, camphoronic acid, citric acid, glyoxylic acid, glycidic acid, glyceric acid, glucaric acid, gluconic acid, croconic acid, cyclobutane carboxylic acid, cyclohexane dicarboxylic acid, diphenyl acetic acid, di-O-benzoyl-tartaric acid, dimethyl succinic acid, dimethoxyphthalic acid, tartronic acid, tannic acid, thiophene carboxylic acid, tiglic acid, desoxalic acid, tetrahydroxy succinic acid, tetramethyl succinic acid, tetronic acid, dihydroacetic acid, terebic acid, tropic acid, vanillic acid, paraconic acid, hydroxyisophthalic acid, hydroxycinnamic acid, hydroxynaphthoic acid, o-hydroxyphenylacetic acid, m-hydroxyphenylacetatic acid, p-hydroxyphenylacetatic acid, 3-hydroxy-3-phenylpropionic acid, pivalic acid, pyridinedicarboxylic acid, pyridine tricarboxylic acid, pyruvic acid, α-phenylcinnamic acid, phenyl glycidic acid, phenyl succinic acid, phenylacetic acid, phenyl lactic acid, propiolic acid, sorbic acid, 2,4-hexadiene dioic acid, 2-benzylidyne propionic acid, 3-benzylidyne propionic acid, benzylidyne malonic acid, benzilic acid, benzene tricarboxylic acid, 1,2-benzene diacetic acid, benzoyloxyacetic acid, benzoyloxy propionic acid, benzoylformic acid, benzoylacetic acid, O-benzoyl lactic acid, 3-benzoyl propionic acid, gallic acid, mesoxalic acid, 5-methyl isophthalic acid, 2-methyl crotonic acid, α-methyl cinnamic acid, methyl succinic acid, methyl malonic acid, 2-methylbutyric acid, o-methoxycinnamic acid, p-methoxycinnamic acid, mercaptosuccinic acid, mercaptoacetic acid, O-lactoyllactic acid, malic acid, leuconic acid, leucic acid, rhodizonic acid, rosolic acid, α-ketoglutaric acid, L-ascorbic acid, iduronic acid, galacturonic acid, glucuronic acid, pyroglutamic acid, ethylenediaminetetraacetic acid, cyano-triacetic acid, aspartic acid, glutamic acid, N'-hydroxyethyl-N,N,N'-triacetic acid, and nitrilotriacetic acid;

a sulfonic acid such as methanesulfonic acid, ethanesulfonic acid, propanesulfonic acid, butanesulfonic acid, pentanesulfonic acid, hexanesulfonic acid, heptanesulfonic acid, octanesulfonic acid, nonanesulfonic acid, decanesulfonic acid, undecane sulfonic acid, dodecane sulfonic acid, tridecane sulfonic acid, tetradecane sulfonic acid, pentadecane sulfonic acid, hexadecane sulfonic acid, heptadecane sulfonic acid, octadecane sulfonic acid, benzenesulfonic acid, naphthalenesulfonic acid, toluenesulfonic acid, hydroxyethane sulfonic acid, hydroxyphenol sulfonic acid, and anthracene sulfonic acid; and a phosphonic acid such as decyl phosphonic acid and phenyl phosphonic acid. Furthermore, the carboxylic acid, sulfonic acid and phosphonic acid may be their derivatives obtained by substituting one or at least two protons of main chains thereof with an atom or atomic group such as F, Cl, Br, I, OH, CN and $NO_2$. They may be used in such a way that one species is used singly or two or more species are used in combination with each other.

The content of the organic acid A (organic acid and/or salts thereof) is in the range of 0.001 to 1 mass % based on the total mass of the polishing liquid. If the content of the organic acid and/or salts thereof is 0.001 mass % or more, there is a tendency that the smoothness of the polishing target film (for example, silicon oxide film) can be improved after the completion of polishing. From this point of view, the content of the organic acid and/or salts thereof is preferably 0.005 mass % or more, and more preferably 0.01 mass % or more. On the other hand, if the content is 1 mass % or less, the polishing speed of the polishing target film is likely to be sufficiently increased, and the aggregation of the cerium oxide particles is likely to be prevented. From this point of view, therefore, the content of the organic acid and/or salts thereof is preferably 0.1 mass % or less, and more preferably 0.05 mass % or less.

The organic acid A has an acid dissociation constant pKa ($pKa_1$ of the first stage which is the lowest acid dissociation constant if number of pKa is two or more) of less than 9 at a room temperature (25° C.); however, pKa of the organic acid A is preferably less than 8, more preferably less than 7, even more preferably than 6, and most preferably than 5. If pKa of the organic acid A is less than 9, at least a portion of the organic acid A in the polishing liquid is changed to organic acid ions to release hydrogen ions, thereby maintaining pH in the desired range.

(Polymer Compound B)

The polishing liquid according to the current embodiment includes a polymer compound B having a carboxylic acid group or carboxylate group. Here, the carboxylic acid group is a functional group expressed as —COOH, and the carboxylate group is a functional group expressed as —COOX (where X is a cation derived from a base and may include, for example, ammonium ion, sodium ion, or potassium ion). In particular, as the polymer compound B, the polishing liquid preferably contains a water-soluble organic polymer and/or salts thereof, which has a carboxylic acid or carboxylate group. Thus, it is possible to improve the smoothness of the polishing target film (for example, silicon oxide film) after the polishing is completed. More specifically, when an uneven polishing target surface is polished, a phenomenon in which a portion of the surface is excessively polished to have a caved-in shape like a dish, which is so-called dishing, may be prevented. This effect can be more effectively achieved by combined use of the water-soluble organic polymer having the carboxylic acid group or carboxylate group and salts thereof, the organic acid and/or salts thereof, and the cerium oxide particles.

Specific examples of the polymer compound B (water-soluble organic polymer having a carboxylic acid group or carboxylate group) may include:

polycarboxyliic acid such as polyaspartic acid, polyglutamic acid, polylysine, polymalic acid, polyamic acid, polyamic acid ammonium salt, polyamide acid sodium salt, and polyglyoxylic acid, and salts thereof; and a homopolymer of monomers having a carboxylic acid group such as acrylic acid, methacrylic acid, maleic acid, and a homopolymer in which a carboxylic acid moiety of the polymer is ammonium salt.

Also, the polymer compound B may include a copolymer of monomers having a carboxylate group and a derivative such as alkyl ester of a carboxylic acid. Specific examples thereof may include poly(meth)acrylic acid, or a polymer in which the carboxylic acid moiety of poly(meth)acrylic acid is substituted with ammonium carboxylate group (hereinafter, ammonium poly(meth)acrylate). Here, the poly(meth)acrylic acid represents at least either one of polyacrylic acid or polymethacrylic acid.

Among these, the polymer compound B is preferably a homopolymer of monomers having a carboxylic acid such as acrylic acid, methacrylic acid, maleic acid, or a homopolymer in which the carboxylic acid moiety of the polymer is an ammonium salt; more preferably a homopolymer of (meth)acrylic acid (poly(meth)acrylic acid) and an ammonium salt thereof; and even more preferably polyacrylic acid and an ammonium salt thereof.

In view of the tendency that the smoothness of the polishing target film (for example, silicon oxide film) after the completion of polishing can be improved, the content of the polymer compound B is 0.01 mass % or more based on the total mass of the polishing liquid; however, from the same point of view, the content of the polymer compound B is preferably 0.02 mass % or more, and more preferably 0.05 mass % or more. If the content is 0.50 mass % or less, the polishing speed of the polishing target film is likely to be sufficiently increased, and the aggregation of the cerium oxide particles is likely to be prevented. Thus, from this point of view, the content of the polymer compound B is 0.50 mass % or less, preferably 0.40 mass % or less, more preferably 0.30 mass % or less, and even more preferably 0.20 mass %.

The weight average molecular weight of the polymer compound B, although not particularly limited, is preferably 100,000 or less, and more preferably 10,000 or less, in view of the tendency that the polishing speed of the polishing target film is sufficiently achieved and the aggregation of the cerium oxide particles is prevented with ease. Also, in view of the tendency that the smoothness enhancement effect is achieved with ease, the weight average molecular weight of the polymer compound B is preferably 1,000 or more. Also, the weight average molecular weight is a value measured according to gel permeation chromatography (GPC), and calculated based on reference polyoxyethyelene.

(Water)

Water, although not particularly limited, is preferably deionized water, ion exchange water, ultra pure water, or the like. The content of water may be a remainder of the contents of the respective components, and is not specifically limited as long as the water is contained in the polishing liquid. Also, the polishing liquid may contain a solvent other than water as necessary, for example, a polar solvent such as ethanol and acetone.

(Dispersant)

The polishing liquid according to the current embodiment may include a dispersant for allowing the cerium oxide particles to be dispersed. The dispersant may include a water-soluble anionic dispersant, water-soluble non-ionic dispersant, water-soluble cationic dispersant, water-soluble amphoteric dispersant, and the like, and is preferably a water-soluble anionic dispersant among others. They may be used in such a way that one species is used singly or two or more species are used in combination with each other. Also, the compound (for example, ammonium polyacrylate) illustrated as an example of the polymer compound B may be used as the dispersant.

The water-soluble anionic dispersant is preferably a polymer containing an acrylic acid as a copolymerization component and salts thereof, and more preferably the salts of the polymer. The polymer containing an acrylic acid as a copolymerization component and the salts thereof may include, for example, a polyacrylic acid and ammonium salts thereof, a copolymer of acrylic acid and methacrylic acid and ammonium salts thereof, and a copolymer of acrylate amide and acrylic acid and ammonium salts thereof.

Other water-soluble anionic dispersants may include, for example, triethanolamine laurylsulfate, ammonium laurylsulfate, triethanolamine polyoxyethylene alkylether sulfate, and special polycarboxylate polymer dispersants.

Furthermore, the water-soluble non-ionic dispersant may include, for example, polyethylene glycol monolaurate, polyethylene glycol monostearate, polyethylene glycol distearate, polyethylene glycol monooleate, polyoxyethylene alkyl amine, polyoxyethylene hydrogenated castor oil, 2-hydroxyethyl methacrylate, and alkyl alkanol amide.

The water-soluble cationic dispersant may include, for example, polyvinyl pyrrolidone, coconut amine acetate, and stearylamine acetate.

The water-soluble amphoteric dispersant may include, for example, lauryl betaine, stearyl betaine, lauryldimethylamine oxide and 2-alkyl-N-carboxymethyl-N-hydroxyethyl imidazolinium betaine.

The content of the dispersant is preferably in the range of 0.001 to 10 mass % based on the total mass of the polishing liquid, for improving the dispersibility of the cerium oxide particles to prevent sedimentation and minimizing polishing scratches on the polishing target film.

The weight average molecular weight of the dispersant, although not specifically limited, is preferably in the range of 100 to 150,000, and more preferably in the range of 1,000 to 20,000. If the molecular weight of the dispersant is 100 or more, a good polishing speed is likely to be achieved when the polishing target film such as a silicon oxide film or a silicon nitride film is polished. If the molecular weight of the dispersant is 150,000 or lower, the storage stability of the polishing liquid is less likely to be decreased. Also, the weight average molecular weight is a value measured according to GPC, and calculated based on reference polyoxyethyelene.

[Other Additives]

The polishing liquid according to the current embodiment may use a water-soluble polymer as an additive in addition to the organic acid and/or salts thereof, and the water-soluble organic polymer having a carboxylic acid group or carboxylate group and/or salts thereof. Such a water-soluble polymer may include, for example, polysaccharides such as alginic acid, pectinic acid, carboxymethyl cellulose, agar, curdlan and pullulan; and vinyl polymers such as polyvinyl alcohol, polyvinyl pyrrolidone and polyacrolein.

The weight average molecular weight of the water-soluble polymer is preferably 500 or more. In addition, the weight average molecular weight is a value measured according to GPC, and calculated based on reference polyoxyethyelene.

Also, the content of the water-soluble polymer is preferably in the range of 0.01 to 5 mass % based on the total mass of the polishing liquid.

[Methods of Preparing and Storing Polishing Liquid]

The polishing liquid according to the current embodiment is obtained by mixing cerium oxide particles, water and a dispersant, then dispersing the cerium oxide particles in the water, and adding an organic acid A and a polymer compound B to the mixture. The polishing liquid according to the current embodiment may be stored as one liquid-type polishing liquid including the cerium oxide particles, dispersant, organic acid A, polymer compound B, water, and optionally a water-soluble polymer. Also, the polishing liquid may be stored as two liquid-type polishing liquid which is composed of cerium oxide slurry (first liquid) containing the cerium oxide particles, dispersant and water, and an additive solution (second liquid) containing the organic acid A, polymer compound B, water and optionally water-soluble polymer.

Also, in the case of the two-liquid type polishing liquid, the additives other than the organic acid A and the polymer compound B may be included in either of the cerium oxide slurry or the additive solution; however, it is desirable that the additives are included in the additive solution because there is no effect on the dispersion stability of the cerium oxide particles.

In the case that the polishing liquid is stored as the two liquid-type polishing liquid by dividing the polishing liquid into the cerium oxide slurry and the additive solution, it is possible to adjust the smoothness characteristic and the polishing speed by optionally changing a mixing ratio of these two liquids. When polishing is performed using the two liquid-type polishing liquid, the cerium oxide slurry and the additive solution may be fed to a polishing pad as they are supplied separately through different supply pipes and then mixed immediately before a supply pipe outlet where the supply pipes are connected, or the cerium oxide slurry and the additive solution may be mixed with each other immediately before polishing.

The polishing liquid and slurry according to the current embodiment may be stored as a stock solution for polishing liquid or a stock solution for slurry, which will be used after dilution to, for example, twice or more with a liquid media such as water, for minimizing costs caused by preservation, transportation, and storage. The respective stock solutions may be diluted with a liquid media immediately before polishing, and may also be diluted on a polishing pad after the stock solution and the liquid media are supplied onto the polishing pad.

A dilution rate of the stock solution is preferably 2 or more, and more preferably 3 or more because reduction in costs caused by preservation, transportation and storage becomes larger as the dilution rate becomes higher. Although the upper limit of the dilution rate is not specifically limited, higher dilution rate results in a greater amount (higher concentration) of a component included in the stock solution, thus resulting in the deterioration of stability during storage. Therefore, the dilution rate is preferably 10 or less, more preferably 7 or less, and even more preferably 5 or less. The liquid components may be divided into three or more liquids, and this case is also the same as above.

The pH of the polishing liquid according to the current embodiment is adjusted to a desired value, and thereafter the polishing liquid is provided for polishing. A pH adjuster, although not specifically limited, may include, for example, an acid such as nitric acid, sulfuric acid, hydrochloric acid, phosphoric acid, boric acid and acetic acid, and a base such as sodium hydroxide, ammonia water, potassium hydroxide and calcium hydroxide. When the polishing liquid is used in polishing of semiconductors, ammonia water or an acidic component is suitably used. As the pH adjuster, the ammonium salt of the water-soluble polymer which is partially neutralized with ammonia in advance may be used.

The pH of the polishing liquid at room temperature (25° C.) is in the range of 4.0 to 7.0. Since the pH is 4.0 or higher, the storage stability of the polishing liquid tends to be improved and the number of scratches of the polishing target film tends to be decreased. From this observation, the pH is preferably 4.5 or higher, and more preferably 4.8 or higher. If the pH is 7.0 or less, the smoothness-enhancing effect can be sufficiently produced. From the same point of view, the pH is preferably 6.5 or less, more preferably 6.0 or less, and even more preferably 5.5 or less. The pH of the polishing liquid may be measured with a pH meter (for example, Model PH81 (trademark) manufactured by Yokogawa Electronic Corp.). For example, after two points calibration is performed using a standard buffer solution (phthalate pH buffer solution, pH: 4.21 (25° C.), and neutral phosphate pH buffer solution, pH: 6.86 (25° C.)), an electrode was put into the polishing liquid, and the pH stabilized after 2 minutes or more at 25° C. was then measured.

Next, use of the polishing liquid according to the current embodiment for polishing a polishing target film formed on the surface of a substrate will be described below.

[Polishing Method]

In a polishing method of a substrate according to the current embodiment, the polishing target film formed on the surface of the substrate is polished using the polishing liquid. More specifically, for example, while the polishing liquid is being supplied between the polishing target film and the polishing pad in a state where the polishing target film formed on the surface of the substrate is pressed against a polishing pad of a polishing table, the polishing target film is polished by moving the substrate and the polishing surface plate relatively to each other.

The substrate may include a substrate for use in production of semiconductor devices, for example, a substrate having an inorganic insulation film formed on a semiconductor substrate, such as a semiconductor substrate having circuit elements and wiring patterns formed thereon, and a semiconductor substrate having circuit elements formed thereon.

The polishing target film may include, for example, an inorganic insulation film such as a silicon oxide film, a silicon nitride film, and a composite film of a silicon oxide film. The inorganic insulation film formed on such a substrate is polished with the polishing liquid according to the current embodiment to thus remove surface irregularity of the inorganic insulation film, and resultantly the substrate is smoothened over the entire surface. Also, the polishing liquid according to the current embodiment may be used for shallow trench isolation.

Hereinafter, the polishing method of the substrate will be more fully described by taking, as an example, the semiconductor substrate with the inorganic insulation film formed thereon.

As a polishing apparatus, a typical polishing apparatus which is equipped with a holder for holding a substrate such as a semiconductor substrate having a polishing target film and a motor of which number of revolutions is adjustable, and has a polishing table to which a polishing pad (abrasive cloth) is attachable may be used. For example, a polisher (Model No. EPO-111) manufactured by Ebara Corporation, and MIRRA and Reflexion polishers manufactured by AMAT may be used as the polishing apparatus.

As a polishing pad, a typical nonwoven fabric, expanded polyurethane, porous fluororesin, and the like, but not specifically limited thereto, may be used. Also, it is desirable that the polishing pad is processed to have a groove for holding the polishing liquid therein.

Although polishing conditions are not particularly limited, it is desirable that a rotational speed of the polishing table is preferably low at 200 rpm or less so as to prevent the semiconductor substrate from being separated, and a pressure (processing load) applied to the semiconductor substrate preferably does not exceed 100 kPa to prevent scratching after polishing. During polishing, the polishing liquid is continuously supplied to the polishing pad using a pump. The supply amount of the polishing liquid is not limited, but, the surface of the polishing pad is preferably covered with the polishing liquid all the time.

Preferably, the semiconductor substrate after polishing is washed thoroughly with running water, and then dried by removing the water droplets remaining on the semiconductor substrate using a spin dryer or the like.

In this way, surface irregularity is removed by polishing the inorganic insulation film of the polishing target film, and it is thus possible to obtain a smoothened surface over the entire surface of the semiconductor substrate. After the smoothened shallow trench is formed, aluminum wirings are formed on the inorganic insulation film, and an inorganic insulation film is formed again between and on the wirings. Thereafter, the inorganic insulation film is polished using the polishing liquid to thereby obtain a smooth surface. By repeating this process several times, a semiconductor substrate having desired number of layers can be produced.

The inorganic insulation film polished by use of the polishing liquid according to the current embodiment may include, for example, a silicon oxide film and a silicon nitride film. The silicon oxide film may be doped with an element such as phosphorous and boron. The inorganic insulation film may be formed with low-pressure CVD, plasma CVD, or the like.

The formation of the silicon oxide film by low-pressure CVD is performed by using monosilane ($SiH_4$) as a Si source and oxygen ($O_2$) as an oxygen source. The $SiH_4$—$O_2$-type oxidation reaction is carried out at a low temperature of 400° C. or less thereby obtaining the silicon oxide film. In some cases, the silicon oxide film obtained by CVD is subjected to heat treatment at 1,000° C. or less. A $SiH_4$—$O_2$—$PH_3$-type reaction gas is preferably used when the silicon oxide film is doped with phosphorous (P) for achieving surface smoothness by high-temperature reflow.

The plasma CVD process has an advantage that chemical reaction, which requires high temperature under normal thermal equilibrium, is carried out at a low temperature. A method of generating plasma may include two methods, that is, a capacitively coupled method and an inductively coupled method. The reaction gas may include $SiH_4$—$N_2O$-type gas using $SiH_4$ as the Si source and $N_2O$ as the oxygen source, and a TEOS—O-type gas (TEOS-plasma CVD method) using tetraethoxysilane (TEOS) as the Si source. The substrate temperature is preferably in the range of 250 to 400° C., and the reaction pressure is preferably in the range of 67 to 400 Pa.

The formation of the silicon nitride film by low-pressure CVD is performed by using dichlorosilane ($SiH_2Cl_2$) as the Si source and ammonia ($NH_3$) as the nitrogen source. The $SiH_2Cl_2$—$NH_3$-type oxidation reaction is carried out at a high temperature of 900° C. thereby obtaining the silicon nitride film. The reaction gas used to form the silicon nitride film by the plasma CVD method may include a $SiH_4$—$NH_3$-type gas containing $SiH_4$ as the Si source and $NH_3$ as the nitrogen source. The substrate temperature is preferably in the range of 300 to 400° C.

The polishing liquid and the polishing method of the substrate according to the current embodiment can be applied not only to the inorganic insulation film formed on the semiconductor substrate but also in a production process for various types of semiconductor devices. The polishing liquid and the polishing method of the substrate according to the current embodiment can be applied to a silicon oxide film formed on a wiring board having predetermined wirings; an inorganic insulation film such as glass and silicon nitride; a film mainly containing polysilicon, Al, Cu, Ti, TiN, W, Ta, TaN, or the like; an optical glass such as photomask, lens, and prism; an inorganic conductive film such as ITO; an optical integrated circuit, photoswitching element, optical waveguide made of glass and a crystalline material; an end face of an optical fiber; optical single crystals such as scintillator; solid-state laser single crystals; blue laser LED sapphire substrates; semiconductor single crystals such as SiC, GaP, and GaAs; a glass plate for magnetic disk; and a magnetic head.

EXAMPLES

Hereinafter, the present invention is described with reference to examples, however, the present invention is not limited to the examples below.

(Preparation of Cerium Oxide Particles)

40 kg of commercially available cerium carbonate hydrate was put into an alumina container and calcined at 830° C. for 2 hours in air to obtain 20 kg of yellow white powders. Phase identification of these powders by X-ray diffractometry showed that the product was cerium oxide. 20 kg of the cerium oxide powders obtained were dry-pulverized by use of a jet mill to obtain powdery (particulate) cerium oxide. Observation of the obtained powdery cerium oxide using a scanning electron miscrope (SEM) showed that crystallite-sized particles and particles consisting of two or more crystallites and having a crystallite grain boundary were included in cerium oxide. 50 crystallites were randomly selected from the acquired SEM image, and then a particle diameter was calculated from the square root of the product of the major axis and minor axis of the particle, resulting in the crystallite diameters of all the crystallites being within the range of 1-300 nm.

Example 1-1

200.0 g of cerium oxide particles thus prepared and 795.0 g of deionized water were mixed, then 5 g of an aqueous ammonium polyacrylate solution (weight average molecular weight: 8,000, 40 mass %) as a dispersant was added, and the resulting mixture was dispersed under ultrasonication while being stirred thereby obtaining a cerium oxide dispersion liquid. The dispersion under ultrasonication was performed at the ultrasonic wave frequency of 400 kHz for a dispersion period of 20 minutes.

Thereafter, 1 kg of the cerium oxide dispersion liquid was put and left in a 1-liter container (height: 170 mm), and then sedimentation classification was performed. After classification for 15 hours, the supernatant liquid at a depth of 13 cm or less from the surface of the water was drawn by a pump. The supernatant cerium oxide dispersion liquid obtained was diluted with deionized water to render the content of the cerium oxide particles be 5 mass %, thereby obtaining a cerium oxide slurry.

To measure the average particle diameter (D50) of the cerium oxide particle in the cerium oxide slurry, the slurry was diluted to have the transmittance (H) of 60-70%, as measured with He—Ne laser, thereby obtaining a sample to be measured. D50 of the sample to be measured was 150 nm, as measured by using a laser-diffraction particle size distribution analyzer, Master Sizer Microplus (trade name, manufactured by Malvern) at a refractive index of 1.93 and absorption of 0.

As the organic acid A, 0.1 g of p-toluenesulfonic acid monohydrate (pKa(25° C.)=−2.8) and 800 g of deionized water were mixed, and then, as the polymer compound B, 2.5 g of aqueous polyacrylic acid solution (weight average molecular weight: 4,000, 40 mass %) was added thereto. Thereafter, ammonia water (25 mass %) was added to adjust pH to 4.5 (25° C.). The deionized water was further added, thereby obtaining a total amount of 850 g of the additive solution of the organic acid.

Then, 134 g of the cerium oxide slurry was added, the resulting mixture was adjusted to pH 5.0 (25° C.) with ammonia water (25 mass %), and deionized water was further added to result in the total amount being 1,000 g, thereby producing a cerium oxide polishing liquid (content of cerium oxide particles: 0.67 mass %).

Also, the average particle diameter D50 of the particles in the polishing liquid, as measured by a laser-diffraction particle size distribution analyzer after production of the sample to be measured as above, was 150 nm.

(Polishing of Insulation Film)

A trade mark "Pattern Wafer 764" (diameter: 300 mm) manufactured by SEMATECH was used as a polishing test wafer. The polishing test wafer and the evaluation method of polishing properties using the same will be described with reference to FIG. 1.

FIG. 1(*a*) is a schematic enlarged sectional view illustrating a portion of a polishing test wafer. A plurality of grooves are formed in the surface of wafer 1, and a silicon nitride film 2 with a thickness of 150 nm (1,500 Å) is formed on the surface of a convex portion of the wafer 1. The depth of the groove (step height from the surface of the convex portion to a bottom of a concave portion) is 500 nm (5,000 Å). Hereinafter, the convex portion is referred to as an active portion, and the concave portion is referred to as a trench portion. Also, although not specifically depicted in FIG. 1, three regions which have sectional widths of the trench portion/active portion being 100 μm/100 μm, 20 μm/80 μm and 80 μm/20 μm are formed in the wafer 1.

FIG. 1(*b*) is a schematic enlarged sectional view illustrating a portion of the polishing test wafer. Over the polishing test wafer, a silicon oxide film 3 is formed on the active portion and the trench portion through plasma-TEOS such that the silicon oxide film 3 has a thickness of 600 nm (6,000 Å) from the surface of the active portion. In the polishing test, smoothening is performed by polishing the silicon oxide film 3 of the polishing test wafer.

FIG. 1(*c*) is a schematic enlarged sectional view illustrating a portion of the polishing test wafer after the silicon oxide film 3 is polished. Polishing is terminated at the surface of the silicon nitride film 2 in the active portion, the time required for the polishing is defined as a polishing period, and a value obtained by subtracting a thickness 5 of the silicon oxide film 3 in the trench portion from a depth 4 of the trench portion is defined as a dishing amount 6. A shorter polishing period is more favorable, and a smaller dishing amount 6 is also more favorable.

A polishing apparatus (Reflexion manufactured by AMAT) was used in polishing of the polishing test wafer. The polishing test wafer was set on a holder to which an absorption pad for mounting a substrate was attached. The polishing pad made of a porous urethane resin (groove shape=perforate type: manufactured by Rohm and Haas, Model No. IC 1010) was attached to the polishing table with a diameter of 600 mm of the polishing apparatus. The holder was further placed on the polishing table with its insulation film (silicon oxide film) face of the polishing target film facing downward, and a processing load was set to 210 gf/cm$^2$ (20.6 kPa).

The polishing test wafer was polished while the polishing table and the polishing test wafer were moved at a speed of 130 rpm and the cerium oxide polishing liquid was dropped onto the polishing pad at a rate of 250 milliliter/minute. A polishing time when the silicon nitride film of the active portion in the 100 μm/100 μm region is exposed was defined as a polishing termination time. The evaluation of the smoothness was performed on the wafer which is over-polished by 20% from the polishing termination time (for example, if the polishing termination time is 100 seconds, the polishing is further performed for 20 seconds thereafter). Over-polishing is performed to facilitate the differences arising between the values of items to be evaluated and therefore the ease of the evaluation, and also to verify the advantage that the figures are good (or properties are good) even when the over-polishing is performed, which lead to the process likelihood in terms of a polishing process. The polishing test wafer after polishing was washed thoroughly with pure water, and then dried.

The following three items were evaluated as evaluation items for smoothness.

Item 1: dishing amount of the trench portion in the 100 μm/100 μm region: measured by use of a stylus type step profiler (Model No. P16, manufactured by KLA-Tencor).

Item 2: SiN loss of the active portion in the 100 μm/100 μm region: the thickness of the silicon nitride (SiN) film removed by polishing was measured using an interference type film thickness measuring device, NanoSpec/AFT5100 (trade mark) manufactured by NanoMatrix Inc.

Item 3: SiO$_2$ remaining film thickness difference (SiO$_2$ density difference) of the trench portions between in the 20 μm/80 μm and 80 μm/20 μm regions: the remaining thickness of the silicon oxide film (SiO$_2$ film) in each region was measured using an interference type film thickness measuring device, NanoSpec/AFT5100 (trade mark) manufactured by NanoMatrix Inc.

Examples 1-2 to 6-9 and Comparative Examples 1-1 to 6-9

Preparation of a cerium oxide polishing liquid and polishing of an insulation film were performed in the same manner as Example 1-1 except for the pH of the polishing liquid, type and amount of the organic acid A, or amount of the polymer compound B, which are listed in Tables 1 to 19. Results are shown in the same Tables. From Tables 1 to 19, it becomes evident that the polishing speed and smoothness are enhanced and the dishing amount is reduced using the polishing liquid according to the present invention.

TABLE 1

| | | Organic acid A | | Polymer compound B | | Polishing result | | | |
|---|---|---|---|---|---|---|---|---|---|
| No. | pH | Name | Mixing amount (mass %) | Name | Mixing amount (mass %) | Polishing period [s] | Dishing [Å] | SiO$_2$ remaining film thickness difference [Å] | SiN loss [Å] |
| (Comparative Example 1-1) | 3.5 | p-toluenesulfonic acid monohydrate | 0.01 | Polyacrylic acid (Mw = 4000) | 0.10 | Evaluation stopped due to aggregation of cerium oxide particles | | | |
| (Example 1-2) | 4.5 | p-toluenesulfonic acid monohydrate | 0.01 | Polyacrylic acid (Mw = 4000) | 0.10 | 160 | 250 | 330 | 44 |
| (Example 1-1) | 5.0 | p-toluenesulfonic acid monohydrate | 0.01 | Polyacrylic acid (Mw = 4000) | 0.10 | 145 | 300 | 350 | 50 |
| (Example 1-3) | 6.0 | p-toluenesulfonic acid monohydrate | 0.01 | Polyacrylic acid (Mw = 4000) | 0.10 | 150 | 320 | 400 | 56 |
| (Comparative Example 1-2) | 8.0 | p-toluenesulfonic acid monohydrate | 0.01 | Polyacrylic acid (Mw = 4000) | 0.10 | 140 | 850 | 800 | 55 |
| (Comparative Example 1-3) | 9.0 | p-toluenesulfonic acid monohydrate | 0.01 | Polyacrylic acid (Mw = 4000) | 0.10 | 135 | 950 | 900 | 56 |
| (Comparative Example 1-4) | 5.0 | None | — | Polyacrylic acid (Mw = 4000) | 0.10 | 135 | 700 | 750 | 120 |

TABLE 2

| | | Organic acid A | | Polymer compound B | | Polishing result | | | |
|---|---|---|---|---|---|---|---|---|---|
| No. | pH | Name | Mixing amount (mass %) | Name | Mixing amount (mass %) | Polishing period [s] | Dishing [Å] | SiO$_2$ remaining film thickness difference [Å] | SiN loss [Å] |
| (Comparative Example 1-4) | 5.0 | None | — | Polyacrylic acid (Mw = 4000) | 0.10 | 135 | 700 | 750 | 120 |
| (Comparative Example 1-5) | 5.0 | p-toluenesulfonic acid monohydrate | 0.0001 | Polyacrylic acid (Mw = 4000) | 0.10 | 140 | 600 | 650 | 100 |
| (Example 1-4) | 5.0 | p-toluenesulfonic acid monohydrate | 0.001 | Polyacrylic acid (Mw = 4000) | 0.10 | 145 | 380 | 420 | 56 |
| (Example 1-1) | 5.0 | p-toluenesulfonic acid monohydrate | 0.01 | Polyacrylic acid (Mw = 4000) | 0.10 | 145 | 300 | 350 | 50 |
| (Example 1-5) | 5.0 | p-toluenesulfonic acid monohydrate | 0.1 | Polyacrylic acid (Mw = 4000) | 0.10 | 160 | 250 | 300 | 46 |
| (Example 1-6) | 5.0 | p-toluenesulfonic acid monohydrate | 1 | Polyacrylic acid (Mw = 4000) | 0.10 | 175 | 260 | 280 | 42 |
| (Comparative Example 1-6) | 5.0 | p-toluenesulfonic acid monohydrate | 10 | Polyacrylic acid (Mw = 4000) | 0.10 | Evaluation stopped due to aggregation of cerium oxide particles | | | |

TABLE 3

| | | Organic acid A | | Polymer compound B | | Polishing result | | | |
|---|---|---|---|---|---|---|---|---|---|
| | | | | | | | | SiO$_2$ remaining film | |
| No. | pH | Name | Mixing amount (mass %) | Name | Mixing amount (mass %) | Polishing period [s] | Dishing [Å] | thickness difference [Å] | SiN loss [Å] |
| (Comparative Example 1-7) | 5.0 | p-toluenesulfonic acid monohydrate | 0.01 | None | — | 130 | 600 | 700 | 200 |
| (Comparative Example 1-8) | 5.0 | p-toluenesulfonic acid monohydrate | 0.01 | Polyacrylic acid (Mw = 4000) | 0.001 | 135 | 550 | 650 | 160 |
| (Example 1-7) | 5.0 | p-toluenesulfonic acid monohydrate | 0.01 | Polyacrylic acid (Mw = 4000) | 0.01 | 140 | 340 | 400 | 60 |
| (Example 1-1) | 5.0 | p-toluenesulfonic acid monohydrate | 0.01 | Polyacrylic acid (Mw = 4000) | 0.10 | 145 | 300 | 350 | 50 |
| (Example 1-8) | 5.0 | p-toluenesulfonic acid monohydrate | 0.01 | Polyacrylic acid (Mw = 4000) | 0.20 | 155 | 260 | 320 | 44 |
| (Example 1-9) | 5.0 | p-toluenesulfonic acid monohydrate | 0.01 | Polyacrylic acid (Mw = 4000) | 0.40 | 164 | 240 | 320 | 42 |
| (Comparative Example 1-9) | 5.0 | p-toluenesulfonic acid monohydrate | 0.01 | Polyacrylic acid (Mw = 4000) | 1.00 | Evaluation stopped due to aggregation of cerium oxide particles | | | |

TABLE 4

| | | Organic acid A | | Polymer compound B | | Polishing result | | | |
|---|---|---|---|---|---|---|---|---|---|
| | | | | | | | | SiO$_2$ remaining film | |
| No. | pH | Name | Mixing amount (mass %) | Name | Mixing amount (mass %) | Polishing period [s] | Dishing [Å] | thickness difference [Å] | SiN loss [Å] |
| (Example 1-1) | 5.0 | p-toluenesulfonic acid monohydrate (pKa = −2.8) | 0.01 | Polyacrylic acid (Mw = 4000) | 0.10 | 145 | 300 | 350 | 50 |
| (Example 1-10) | 5.0 | Maleic acid (pKa = 1.8) | 0.01 | Polyacrylic acid (Mw = 4000) | 0.10 | 140 | 320 | 340 | 50 |
| (Example 1-11) | 5.0 | Malic acid (pKa = 3.4) | 0.01 | Polyacrylic acid (Mw = 4000) | 0.10 | 150 | 330 | 360 | 60 |
| (Example 1-12) | 5.0 | Succinic acid (pKa = 4.2) | 0.01 | Polyacrylic acid (Mw = 4000) | 0.10 | 155 | 330 | 370 | 55 |
| (Example 1-13) | 5.0 | Acetic acid (pKa = 4.8) | 0.01 | Polyacrylic acid (Mw = 4000) | 0.10 | 140 | 290 | 330 | 45 |
| (Example 1-14) | 5.0 | Propionic acid (pKa = 4.9) | 0.01 | Polyacrylic acid (Mw = 4000) | 0.10 | 150 | 310 | 360 | 60 |
| (Comparative Example 1-10) | 7.0 | Catechol (pKa = 9.2) | 0.01 | Polyacrylic acid (Mw = 4000) | 0.10 | 150 | 750 | 800 | 110 |
| (Comparative Example 1-11) | 7.0 | Phenol (pKa = 10.0) | 0.01 | Polyacrylic acid (Mw = 4000) | 0.10 | 150 | 700 | 750 | 105 |

TABLE 5

| No. | pH | Organic acid A Name | Mixing amount (mass %) | Polymer compound B Name | Mixing amount (mass %) | Polishing period [s] | Dishing [Å] | SiO$_2$ remaining film thickness difference [Å] | SiN loss [Å] |
|---|---|---|---|---|---|---|---|---|---|
| (Comparative Example 2-1) | 3.5 | Malic acid | 0.01 | Polyacrylic acid (Mw = 4000) | 0.10 | Evaluation stopped due to aggregation of cerium oxide particles | | | |
| (Example 2-2) | 4.5 | Malic acid | 0.01 | Polyacrylic acid (Mw = 4000) | 0.10 | 170 | 270 | 320 | 48 |
| (Example 2-1) | 5.0 | Malic acid | 0.01 | Polyacrylic acid (Mw = 4000) | 0.10 | 150 | 330 | 360 | 60 |
| (Example 2-3) | 6.0 | Malic acid | 0.01 | Polyacrylic acid (Mw = 4000) | 0.10 | 155 | 310 | 390 | 54 |
| (Comparative Example 2-2) | 8.0 | Malic acid | 0.01 | Polyacrylic acid (Mw = 4000) | 0.10 | 150 | 840 | 790 | 54 |
| (Comparative Example 2-3) | 9.0 | Malic acid | 0.01 | Polyacrylic acid (Mw = 4000) | 0.10 | 145 | 930 | 920 | 55 |
| (Comparative Example 2-4) | 5.0 | None | — | Polyacrylic acid (Mw = 4000) | 0.10 | 135 | 700 | 750 | 120 |

TABLE 6

| No. | pH | Organic acid A Name | Mixing amount (mass %) | Polymer compound B Name | Mixing amount (mass %) | Polishing period [s] | Dishing [Å] | SiO$_2$ remaining film thickness difference [Å] | SiN loss [Å] |
|---|---|---|---|---|---|---|---|---|---|
| (Comparative Example 2-4) | 5.0 | None | — | Polyacrylic acid (Mw = 4000) | 0.10 | 135 | 700 | 750 | 120 |
| (Comparative Example 2-5) | 5.0 | Malic acid | 0.0001 | Polyacrylic acid (Mw = 4000) | 0.10 | 145 | 630 | 650 | 110 |
| (Example 2-4) | 5.0 | Malic acid | 0.001 | Polyacrylic acid (Mw = 4000) | 0.10 | 148 | 380 | 420 | 50 |
| (Example 2-1) | 5.0 | Malic acid | 0.01 | Polyacrylic acid (Mw = 4000) | 0.10 | 150 | 330 | 360 | 60 |
| (Example 2-5) | 5.0 | Malic acid | 0.1 | Polyacrylic acid (Mw = 4000) | 0.10 | 162 | 260 | 320 | 48 |
| (Example 2-6) | 5.0 | Malic acid | 1 | Polyacrylic acid (Mw = 4000) | 0.10 | 170 | 240 | 290 | 45 |
| (Comparative Example 2-6) | 5.0 | Malic acid | 10 | Polyacrylic acid (Mw = 4000) | 0.10 | Evaluation stopped due to aggregation of cerium oxide particles | | | |

TABLE 7

| No. | pH | Organic acid A Name | Mixing amount (mass %) | Polymer compound B Name | Mixing amount (mass %) | Polishing period [s] | Dishing [Å] | SiO$_2$ remaining film thickness difference [Å] | SiN loss [Å] |
|---|---|---|---|---|---|---|---|---|---|
| (Comparative Example 2-7) | 5.0 | Malic acid | 0.01 | None | — | 125 | 600 | 720 | 230 |
| (Comparative Example 2-8) | 5.0 | Malic acid | 0.01 | Polyacrylic acid (Mw = 4000) | 0.001 | 140 | 550 | 660 | 180 |
| (Example 2-7) | 5.0 | Malic acid | 0.01 | Polyacrylic acid (Mw = 4000) | 0.01 | 145 | 340 | 390 | 60 |
| (Example 2-1) | 5.0 | Malic acid | 0.01 | Polyacrylic acid (Mw = 4000) | 0.10 | 150 | 330 | 360 | 60 |
| (Example 2-8) | 5.0 | Malic acid | 0.01 | Polyacrylic acid (Mw = 4000) | 0.20 | 160 | 250 | 320 | 48 |
| (Example 2-9) | 5.0 | Malic acid | 0.01 | Polyacrylic acid (Mw = 4000) | 0.40 | 168 | 260 | 320 | 50 |
| (Comparative Example 2-9) | 5.0 | Malic acid | 0.01 | Polyacrylic acid (Mw = 4000) | 1.00 | Evaluation stopped due to aggregation of cerium oxide particles | | | |

TABLE 8

| No. | pH | Organic acid A Name | Mixing amount (mass %) | Polymer compound B Name | Mixing amount (mass %) | Polishing period [s] | Dishing [Å] | SiO$_2$ remaining film thickness difference [Å] | SiN loss [Å] |
|---|---|---|---|---|---|---|---|---|---|
| (Comparative Example 3-1) | 3.5 | Acetic acid | 0.01 | Polyacrylic acid (Mw = 4000) | 0.10 | Evaluation stopped due to aggregation of cerium oxide particles | | | |
| (Example 3-2) | 4.5 | Acetic acid | 0.01 | Polyacrylic acid (Mw = 4000) | 0.10 | 160 | 270 | 330 | 45 |
| (Example 3-1) | 5.0 | Acetic acid | 0.01 | Polyacrylic acid (Mw = 4000) | 0.10 | 140 | 290 | 330 | 45 |
| (Example 3-3) | 6.0 | Acetic acid | 0.01 | Polyacrylic acid (Mw = 4000) | 0.10 | 140 | 340 | 390 | 55 |
| (Comparative Example 3-2) | 8.0 | Acetic acid | 0.01 | Polyacrylic acid (Mw = 4000) | 0.10 | 135 | 840 | 790 | 55 |
| (Comparative Example 3-3) | 9.0 | Acetic acid | 0.01 | Polyacrylic acid (Mw = 4000) | 0.10 | 134 | 940 | 900 | 52 |
| (Comparative Example 3-4) | 5.0 | None | — | Polyacrylic acid (Mw = 4000) | 0.10 | 135 | 700 | 750 | 120 |

TABLE 9

| | | Organic acid A | | Polymer compound B | | Polishing result | | | |
|---|---|---|---|---|---|---|---|---|---|
| | | | | | | Polishing | | SiO$_2$ remaining film thickness | SiN |
| No. | pH | Name | Mixing amount (mass %) | Name | Mixing amount (mass %) | period [s] | Dishing [Å] | difference [Å] | loss [Å] |
| (Comparative Example 3-4) | 5.0 | None | — | Polyacrylic acid (Mw = 4000) | 0.10 | 135 | 700 | 750 | 120 |
| (Comparative Example 3-5) | 5.0 | Acetic acid | 0.0001 | Polyacrylic acid (Mw = 4000) | 0.10 | 142 | 620 | 670 | 100 |
| (Example 3-4) | 5.0 | Acetic acid | 0.001 | Polyacrylic acid (Mw = 4000) | 0.10 | 145 | 360 | 410 | 56 |
| (Example 3-1) | 5.0 | Acetic acid | 0.01 | Polyacrylic acid (Mw = 4000) | 0.10 | 140 | 290 | 330 | 45 |
| (Example 3-5) | 5.0 | Acetic acid | 0.1 | Polyacrylic acid (Mw = 4000) | 0.10 | 165 | 260 | 310 | 46 |
| (Example 3-6) | 5.0 | Acetic acid | 1 | Polyacrylic acid (Mw = 4000) | 0.10 | 176 | 270 | 290 | 42 |
| (Comparative Example 3-6) | 5.0 | Acetic acid | 10 | Polyacrylic acid (Mw = 4000) | 0.10 | Evaluation stopped due to aggregation of cerium oxide particles | | | |

TABLE 10

| | | Organic acid A | | Polymer compound B | | Polishing result | | | |
|---|---|---|---|---|---|---|---|---|---|
| | | | | | | Polishing | | SiO$_2$ remaining film thickness | SiN |
| No. | pH | Name | Mixing amount (mass %) | Name | Mixing amount (mass %) | period [s] | Dishing [Å] | difference [Å] | loss [Å] |
| (Comparative Example 3-7) | 5.0 | Acetic acid | 0.01 | None | — | 132 | 620 | 710 | 220 |
| (Comparative Example 3-8) | 5.0 | Acetic acid | 0.01 | Polyacrylic acid (Mw = 4000) | 0.001 | 136 | 560 | 660 | 150 |
| (Example 3-7) | 5.0 | Acetic acid | 0.01 | Polyacrylic acid (Mw = 4000) | 0.01 | 140 | 350 | 420 | 55 |
| (Example 3-1) | 5.0 | Acetic acid | 0.01 | Polyacrylic acid (Mw = 4000) | 0.10 | 140 | 290 | 330 | 45 |
| (Example 3-8) | 5.0 | Acetic acid | 0.01 | Polyacrylic acid (Mw = 4000) | 0.20 | 155 | 250 | 320 | 43 |
| (Example 3-9) | 5.0 | Acetic acid | 0.01 | Polyacrylic acid (Mw = 4000) | 0.40 | 165 | 230 | 310 | 40 |
| (Comparative Example 3-9) | 5.0 | Acetic acid | 0.01 | Polyacrylic acid (Mw = 4000) | 1.00 | Evaluation stopped due to aggregation of cerium oxide particles | | | |

TABLE 11

| No. | pH | Organic acid A Name | Mixing amount (mass %) | Polymer compound B Name | Mixing amount (mass %) | Polishing result Polishing period [s] | Dishing [Å] | SiO$_2$ remaining film thickness difference [Å] | SiN loss [Å] |
|---|---|---|---|---|---|---|---|---|---|
| (Comparative Example 4-1) | 3.5 | Succinic acid | 0.01 | Polyacrylic acid (Mw = 4000) | 0.10 | Evaluation stopped due to aggregation of cerium oxide particles | | | |
| (Example 4-2) | 4.5 | Succinic acid | 0.01 | Polyacrylic acid (Mw = 4000) | 0.10 | 170 | 280 | 350 | 50 |
| (Example 4-1) | 5.0 | Succinic acid | 0.01 | Polyacrylic acid (Mw = 4000) | 0.10 | 155 | 330 | 370 | 55 |
| (Example 4-3) | 6.0 | Succinic acid | 0.01 | Polyacrylic acid (Mw = 4000) | 0.10 | 155 | 320 | 400 | 60 |
| (Comparative Example 4-2) | 8.0 | Succinic acid | 0.01 | Polyacrylic acid (Mw = 4000) | 0.10 | 150 | 840 | 820 | 50 |
| (Comparative Example 4-3) | 9.0 | Succinic acid | 0.01 | Polyacrylic acid (Mw = 4000) | 0.10 | 145 | 980 | 940 | 55 |
| (Comparative Example 4-4) | 5.0 | None | — | Polyacrylic acid (Mw = 4000) | 0.10 | 135 | 700 | 750 | 125 |

TABLE 12

| No. | pH | Organic acid A Name | Mixing amount (mass %) | Polymer compound B Name | Mixing amount (mass %) | Polishing result Polishing period [s] | Dishing [Å] | SiO$_2$ remaining film thickness difference [Å] | SiN loss [Å] |
|---|---|---|---|---|---|---|---|---|---|
| (Comparative Example 4-4) | 5.0 | None | — | Polyacrylic acid (Mw = 4000) | 0.10 | 135 | 700 | 750 | 125 |
| (Comparative Example 4-5) | 5.0 | Succinic acid | 0.0001 | Polyacrylic acid (Mw = 4000) | 0.10 | 140 | 650 | 700 | 115 |
| (Example 4-4) | 5.0 | Succinic acid | 0.001 | Polyacrylic acid (Mw = 4000) | 0.10 | 148 | 390 | 430 | 58 |
| (Example 4-1) | 5.0 | Succinic acid | 0.01 | Polyacrylic acid (Mw = 4000) | 0.10 | 155 | 330 | 370 | 55 |
| (Example 4-5) | 5.0 | Succinic acid | 0.1 | Polyacrylic acid (Mw = 4000) | 0.10 | 165 | 280 | 330 | 48 |
| (Example 4-6) | 5.0 | Succinic acid | 1 | Polyacrylic acid (Mw = 4000) | 0.10 | 180 | 280 | 300 | 48 |
| (Comparative Example 4-6) | 5.0 | Succinic acid | 10 | Polyacrylic acid (Mw = 4000) | 0.10 | Evaluation stopped due to aggregation of cerium oxide particles | | | |

TABLE 13

| No. | pH | Organic acid A Name | Mixing amount (mass %) | Polymer compound B Name | Mixing amount (mass %) | Polishing period [s] | Dishing [Å] | SiO₂ remaining film thickness difference [Å] | SiN loss [Å] |
|---|---|---|---|---|---|---|---|---|---|
| (Comparative Example 4-7) | 5.0 | Succinic acid | 0.01 | None | — | 140 | 640 | 740 | 240 |
| (Comparative Example 4-8) | 5.0 | Succinic acid | 0.01 | Polyacrylic acid (Mw = 4000) | 0.001 | 145 | 580 | 670 | 190 |
| (Example 4-7) | 5.0 | Succinic acid | 0.01 | Polyacrylic acid (Mw = 4000) | 0.01 | 150 | 350 | 420 | 55 |
| (Example 4-1) | 5.0 | Succinic acid | 0.01 | Polyacrylic acid (Mw = 4000) | 0.10 | 155 | 330 | 370 | 55 |
| (Example 4-8) | 5.0 | Succinic acid | 0.01 | Polyacrylic acid (Mw = 4000) | 0.20 | 155 | 280 | 340 | 50 |
| (Example 4-9) | 5.0 | Succinic acid | 0.01 | Polyacrylic acid (Mw = 4000) | 0.40 | 170 | 260 | 330 | 48 |
| (Comparative Example 4-9) | 5.0 | Succinic acid | 0.01 | Polyacrylic acid (Mw = 4000) | 1.00 | Evaluation stopped due to aggregation of cerium oxide particles | | | |

TABLE 14

| No. | pH | Organic acid A Name | Mixing amount (mass %) | Polymer compound B Name | Mixing amount (mass %) | Polishing period [s] | Dishing [Å] | SiO₂ remaining film thickness difference [Å] | SiN loss [Å] |
|---|---|---|---|---|---|---|---|---|---|
| (Comparative Example 5-1) | 3.5 | Maleic acid | 0.01 | Polyacrylic acid (Mw = 4000) | 0.10 | Evaluation stopped due to aggregation of cerium oxide particles | | | |
| (Example 5-2) | 4.5 | Maleic acid | 0.01 | Polyacrylic acid (Mw = 4000) | 0.10 | 150 | 260 | 330 | 52 |
| (Example 5-1) | 5.0 | Maleic acid | 0.01 | Polyacrylic acid (Mw = 4000) | 0.10 | 140 | 320 | 340 | 50 |
| (Example 5-3) | 6.0 | Maleic acid | 0.01 | Polyacrylic acid (Mw = 4000) | 0.10 | 135 | 310 | 380 | 52 |
| (Comparative Example 5-2) | 8.0 | Maleic acid | 0.01 | Polyacrylic acid (Mw = 4000) | 0.10 | 130 | 830 | 810 | 50 |
| (Comparative Example 5-3) | 9.0 | Maleic acid | 0.01 | Polyacrylic acid (Mw = 4000) | 0.10 | 130 | 930 | 870 | 60 |
| (Comparative Example 5-4) | 5.0 | None | — | Polyacrylic acid (Mw = 4000) | 0.10 | 135 | 700 | 750 | 120 |

TABLE 15

| | | Organic acid A | | Polymer compound B | | Polishing result | | | |
|---|---|---|---|---|---|---|---|---|---|
| | | | | | | | | SiO$_2$ remaining film | |
| No. | pH | Name | Mixing amount (mass %) | Name | Mixing amount (mass %) | Polishing period [s] | Dishing [Å] | thickness difference [Å] | SiN loss [Å] |
| (Comparative Example 5-4) | 5.0 | None | — | Polyacrylic acid (Mw = 4000) | 0.10 | 135 | 700 | 750 | 120 |
| (Comparative Example 5-5) | 5.0 | Maleic acid | 0.0001 | Polyacrylic acid (Mw = 4000) | 0.10 | 135 | 590 | 640 | 105 |
| (Example 5-4) | 5.0 | Maleic acid | 0.001 | Polyacrylic acid (Mw = 4000) | 0.10 | 140 | 370 | 410 | 52 |
| (Example 5-1) | 5.0 | Maleic acid | 0.01 | Polyacrylic acid (Mw = 4000) | 0.10 | 140 | 320 | 340 | 50 |
| (Example 5-5) | 5.0 | Maleic acid | 0.1 | Polyacrylic acid (Mw = 4000) | 0.10 | 155 | 240 | 290 | 48 |
| (Example 5-6) | 5.0 | Maleic acid | 1 | Polyacrylic acid (Mw = 4000) | 0.10 | 170 | 220 | 270 | 50 |
| (Comparative Example 5-6) | 5.0 | Maleic acid | 10 | Polyacrylic acid (Mw = 4000) | 0.10 | Evaluation stopped due to aggregation of cerium oxide particles | | | |

TABLE 16

| | | Organic acid A | | Polymer compound B | | Polishing result | | | |
|---|---|---|---|---|---|---|---|---|---|
| | | | | | | | | SiO$_2$ remaining film | |
| No. | pH | Name | Mixing amount (mass %) | Name | Mixing amount (mass %) | Polishing period [s] | Dishing [Å] | thickness difference [Å] | SiN loss [Å] |
| (Comparative Example 5-7) | 5.0 | Maleic acid | 0.01 | None | — | 120 | 580 | 680 | 230 |
| (Comparative Example 5-8) | 5.0 | Maleic acid | 0.01 | Polyacrylic acid (Mw = 4000) | 0.001 | 132 | 570 | 620 | 180 |
| (Example 5-7) | 5.0 | Maleic acid | 0.01 | Polyacrylic acid (Mw = 4000) | 0.01 | 136 | 340 | 400 | 58 |
| (Example 5-1) | 5.0 | Maleic acid | 0.01 | Polyacrylic acid (Mw = 4000) | 0.10 | 140 | 320 | 340 | 50 |
| (Example 5-8) | 5.0 | Maleic acid | 0.01 | Polyacrylic acid (Mw = 4000) | 0.20 | 150 | 250 | 310 | 44 |
| (Example 5-9) | 5.0 | Maleic acid | 0.01 | Polyacrylic acid (Mw = 4000) | 0.40 | 160 | 230 | 310 | 50 |
| (Comparative Example 5-9) | 5.0 | Maleic acid | 0.01 | Polyacrylic acid (Mw = 4000) | 1.00 | Evaluation stopped due to aggregation of cerium oxide particles | | | |

TABLE 17

| No. | pH | Organic acid A Name | Mixing amount (mass %) | Polymer compound B Name | Mixing amount (mass %) | Polishing period [s] | Dishing [Å] | SiO$_2$ remaining film thickness difference [Å] | SiN loss [Å] |
|---|---|---|---|---|---|---|---|---|---|
| (Comparative Example 6-1) | 3.5 | Propionic acid | 0.01 | Polyacrylic acid (Mw = 4000) | 0.10 | Evaluation stopped due to aggregation of cerium oxide particles | | | |
| (Example 6-2) | 4.5 | Propionic acid | 0.01 | Polyacrylic acid (Mw = 4000) | 0.10 | 160 | 250 | 330 | 44 |
| (Example 6-1) | 5.0 | Propionic acid | 0.01 | Polyacrylic acid (Mw = 4000) | 0.10 | 150 | 310 | 360 | 60 |
| (Example 6-3) | 6.0 | Propionic acid | 0.01 | Polyacrylic acid (Mw = 4000) | 0.10 | 150 | 330 | 390 | 60 |
| (Comparative Example 6-2) | 8.0 | Propionic acid | 0.01 | Polyacrylic acid (Mw = 4000) | 0.10 | 140 | 840 | 780 | 55 |
| (Comparative Example 6-3) | 9.0 | Propionic acid | 0.01 | Polyacrylic acid (Mw = 4000) | 0.10 | 138 | 940 | 910 | 60 |
| (Comparative Example 6-4) | 5.0 | None | — | Polyacrylic acid (Mw = 4000) | 0.10 | 135 | 700 | 750 | 120 |

TABLE 18

| No. | pH | Organic acid A Name | Mixing amount (mass %) | Polymer compound B Name | Mixing amount (mass %) | Polishing period [s] | Dishing [Å] | SiO$_2$ remaining film thickness difference [Å] | SiN loss [Å] |
|---|---|---|---|---|---|---|---|---|---|
| (Comparative Example 6-4) | 5.0 | None | — | Polyacrylic acid (Mw = 4000) | 0.10 | 135 | 700 | 750 | 120 |
| (Comparative Example 6-5) | 5.0 | Propionic acid | 0.0001 | Polyacrylic acid (Mw = 4000) | 0.10 | 142 | 630 | 660 | 110 |
| (Example 6-4) | 5.0 | Propionic acid | 0.001 | Polyacrylic acid (Mw = 4000) | 0.10 | 146 | 380 | 420 | 55 |
| (Example 6-1) | 5.0 | Propionic acid | 0.01 | Polyacrylic acid (Mw = 4000) | 0.10 | 150 | 310 | 360 | 60 |
| (Example 6-5) | 5.0 | Propionic acid | 0.1 | Polyacrylic acid (Mw = 4000) | 0.10 | 158 | 260 | 310 | 42 |
| (Example 6-6) | 5.0 | Propionic acid | 1 | Polyacrylic acid (Mw = 4000) | 0.10 | 165 | 260 | 300 | 40 |
| (Comparative Example 6-6) | 5.0 | Propionic acid | 10 | Polyacrylic acid (Mw = 4000) | 0.10 | Evaluation stopped due to aggregation of cerium oxide particles | | | |

TABLE 19

| No. | pH | Organic acid A Name | Mixing amount (mass %) | Polymer compound B Name | Mixing amount (mass %) | Polishing period [s] | Dishing [Å] | SiO$_2$ remaining film thickness difference [Å] | SiN loss [Å] |
|---|---|---|---|---|---|---|---|---|---|
| (Comparative Example 6-7) | 5.0 | Propionic acid | 0.01 | None | — | 130 | 650 | 720 | 210 |
| (Comparative Example 6-8) | 5.0 | Propionic acid | 0.01 | Polyacrylic acid (Mw = 4000) | 0.001 | 142 | 580 | 690 | 180 |
| (Example 6-7) | 5.0 | Propionic acid | 0.01 | Polyacrylic acid (Mw = 4000) | 0.01 | 145 | 350 | 390 | 62 |
| (Example 6-1) | 5.0 | Propionic acid | 0.01 | Polyacrylic acid (Mw = 4000) | 0.10 | 150 | 310 | 360 | 60 |
| (Example 6-8) | 5.0 | Propionic acid | 0.01 | Polyacrylic acid (Mw = 4000) | 0.20 | 156 | 270 | 320 | 48 |
| (Example 6-9) | 5.0 | Propionic acid | 0.01 | Polyacrylic acid (Mw = 4000) | 0.40 | 165 | 260 | 320 | 50 |
| (Comparative Example 6-9) | 5.0 | Propionic acid | 0.01 | Polyacrylic acid (Mw = 4000) | 1.00 | Evaluation stopped due to aggregation of cerium oxide particles | | | |

LIST OF REFERENCE SIGNS

1 . . . wafer; 2 . . . silicon nitride film; 3 . . . silicon oxide film formed by plasma TEOS; 4 . . . depth of trench portion; 5 . . . thickness of silicon oxide film of trench portion after polishing; 6 . . . dishing amount

The invention claimed is:

1. A polishing liquid for chemical mechanical polishing comprising: cerium oxide particles, an organic acid A, a polymer compound B having a carboxyl acid group or a carboxylate group, and water,
wherein the organic acid A is p-toluenesulfonic acid,
a content of the organic acid A is 0.001 to 1 mass % with respect to the total mass of the polishing liquid,
a content of the polymer compound B is 0.01 to 0.50 mass % with respect to the total mass of the polishing liquid, and
a pH of the polishing liquid is in the range of 4.0 to 7.0.

2. The polishing liquid according to claim 1, wherein the polishing liquid is stored as a two liquid-type polishing liquid consisting of a first liquid comprising the cerium oxide particles and the water, and a second liquid comprising the organic acid A, the polymer compound B and the water,
wherein the first liquid and the second liquid are combined prior to use, thereby forming the polishing liquid.

3. The polishing liquid according to claim 2, wherein the first liquid further comprises a dispersant.

4. The polishing liquid according to claim 1, wherein the polymer compound B is poly(meth)acrylic acid.

5. A substrate polishing method for polishing a polishing target film formed on a surface of a substrate, the method comprising the steps of:
(a) providing a polishing target film formed on a surface of a substrate;
(b) providing the polishing liquid according to claim 1; and
(c) polishing the polishing target film with the polishing liquid according to claim 1.

6. A substrate polishing method for polishing a polishing target film formed on a surface of a substrate, the method comprising the steps of:
(a) providing a polishing target film formed on a surface of a substrate;
(b) providing the polishing liquid according to claim 2; and
(c) polishing the polishing target film with the polishing liquid according to claim 2.

7. A substrate polishing method for polishing a polishing target film formed on a surface of a substrate, the method comprising the steps of:
(a) providing a polishing target film formed on a surface of a substrate;
(b) providing the polishing liquid according to claim 3; and
(c) polishing the polishing target film with the polishing liquid according to claim 3.

* * * * *